United States Patent [19]
Dixon

[11] Patent Number: 5,872,790
[45] Date of Patent: Feb. 16, 1999

[54] ECC MEMORY MULTI-BIT ERROR GENERATOR

[75] Inventor: Robert Christopher Dixon, Austin, Tex.

[73] Assignee: International Business Machines Corporation, Armonk, N.Y.

[21] Appl. No.: 808,411

[22] Filed: Feb. 28, 1997

[51] Int. Cl.[6] ................................................. G06F 11/00
[52] U.S. Cl. ........................................ 371/3; 395/185.01
[58] Field of Search ................................ 371/3, 20.1, 21; 370/225; 395/185.01

[56] References Cited

U.S. PATENT DOCUMENTS

| | | | |
|---|---|---|---|
| 4,360,915 | 11/1982 | Sindelar | 371/13 |
| 4,376,998 | 3/1983 | Abbott et al. | 370/225 |
| 4,410,984 | 10/1983 | Negi et al. | 371/16 |
| 4,561,095 | 12/1985 | Khan | 371/38 |
| 4,689,792 | 8/1987 | Traynor | 371/38 |
| 4,926,426 | 5/1990 | Scheuneman et al. | 371/40.1 |

*Primary Examiner*—Phung M. Chung
*Attorney, Agent, or Firm*—Volel Emilo; Jack V. Musgrove; Andrew J. Dillon

[57] ABSTRACT

An error generator for use with a memory device, such as dynamic random-access memory (DRAM) which is connected to an error detection or correction device, such as a memory controller using error-correcting code. The memory error generator uses a clock signal provided by the computer system, determines when the computer system first attempts to read from a data stream after synchronization, and thereafter introduces the error in at least one bit of the data stream by complementing the bit. The error generator can be provided with a switch such that synchronization is performed in response to activation of the switch. The error generator preferably is constructed using an inexpensive device, such as a programmable array logic (PAL) circuit. Use of a PAL allows the bit complementing to occur quickly enough to meet timing requirements of the memory controller. The PAL and switch can be mounted on an interposer which is removably connected to the memory array and the memory controller.

18 Claims, 3 Drawing Sheets

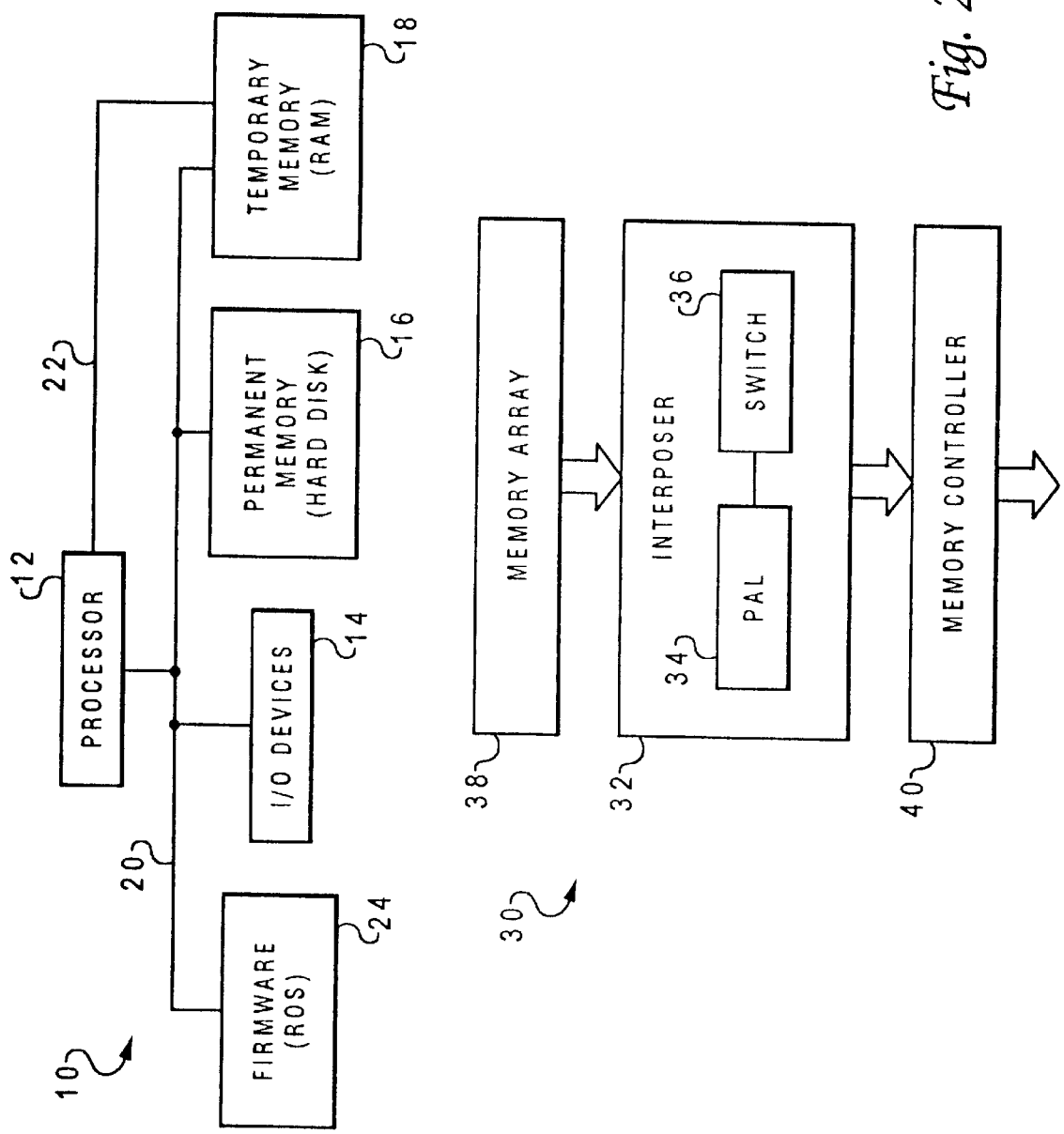

ECC MEMORY MULTI-BIT ERROR GENERATOR

BACKGROUND OF THE INVENTION

1. Field of the Invention

The present invention generally relates to computer systems and, more particularly, to a method of simulating errors in the retrieval of information from a computer memory for testing an error detection or correction device.

2. Description of the Related Art

The basic structure of a conventional computer system 10 is shown in FIG. 1. The heart of computer system 10 is a central processing unit (CPU) or processor 12 which is connected to several peripheral devices, including input/output (I/O) devices 14 (such as a display monitor and keyboard) for the user interface, a permanent memory device 16 (such as a hard disk or floppy diskette) for storing the computer's operating system and user programs, and a temporary memory device 18 (such as dynamic random-access memory or DRAM) that is used by processor 12 to carry out program instructions. Processor 12 communicates with the peripheral devices by various means, including a bus 20 or a direct channel 22. Computer system 10 may have many additional components which are not shown, such as serial and parallel ports for connection to, e.g., modems or printers. There are other components that might be used in conjunction with those shown in the block diagram of FIG. 1; for example, a display adapter connected to processor 12 might be used to control a video-display monitor. Computer system 10 also includes firmware 24 whose primary purpose is to seek out and load an operating system from one of the peripherals (usually permanent memory device 16) whenever the computer is first turned on.

Parity checks and error-correction codes (ECCs) are commonly used to ensure that data is properly transferred between system components. For example, a magnetic disk (permanent memory device) typically records not only information that comprises data to be retrieved for processing, but also records an error correction code for each file, which allows the processor, or a controller, to determine whether the data retrieved is valid. ECCs are also used with temporary memory devices, e.g., DRAM, and the ECC for files stored in DRAM can be analyzed by a memory controller which provides an interface between the processor and the DRAM array. If a memory cell fails during reading of a particular memory word (due to, e.g. stray radiation, electrostatic discharge, or a defective cell), then the failure can at least be detected so that further action can be taken, e.g., re-trying the read operation to see if the failure occurs again, as taught in U.S. Pat. No. 4,360,915. ECCs can further be used to reconstruct the proper data stream. See, e.g., U.S. Pat. No. 4,561,095 which discloses a high-speed error correcting a random-access memory system which uses a plurality of parity bits stored in memory along with the associated data bits.

Some error correction codes can only be used to detect single-bit errors, i.e., if two or more bits in a particular memory word are invalid, then the ECC might not be able to determine what the proper data stream should actually be. Other ECCs are more sophisticated and allow detection or correction of double errors, and some ECCs further allow the memory word to be broken up into clusters of bits, or "symbols," which can then be analyzed for errors in more detail.

Parity and error-correcting code DRAM controllers need special hardware to generate simulated errors, including both single and multi-bit errors. This hardware generates data patterns which, in turn, are used to generate fault data in real-time. This hardware is relatively expensive and, further, leaves the system response to actual memory errors untested in the development phase and manufacturing phase. It would, therefore, be advantageous to devise an inexpensive hardware technique to generate single- and multiple-bit memory errors which can be used with actual system memory. It would be further advantageous if the hardware could also be used with a memory controller which has no internal means of testing parity or ECC circuitry.

SUMMARY OF THE INVENTION

It is therefore one object of the present invention to provide a method of testing an error detection device in a computer system.

It is another object of the present invention to provide such a method wherein the device is a memory controller receiving information from a temporary memory device such as DRAM.

It is yet another object of the present invention to provide such a method which generates single- and multi-bit errors for both parity checks and error-correction codes.

The foregoing objects are achieved in a method of introducing an error into a data stream being transmitted in a computer system, generally comprising the steps of synchronizing an error generator using a clock signal provided by the computer system, determining when the computer system first attempts to read from the data stream after the synchronization, and thereafter introducing an error in at least one bit of the data stream by complementing the bit. The error generator can be provided with a switch such that the synchronizing step is performed in response to activation of the switch. The error generator can also introduce two errors by complementing two bits in the data stream. The error generator preferably is constructed using an inexpensive device, such as a programmable array logic (PAL) circuit which routes the data stream. The invention is particularly suited for introducing an error in a data stream transmitted from a memory array to a memory controller, and use of a PAL allows the bit complementing to occur quickly enough to meet timing requirements of the memory controller. The PAL and switch can be mounted on an interposer which is removably connected to the memory array and the memory controller.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

FIG. 1 is a block diagram of a conventional computer system;

FIG. 2 is a block diagram of the memory error generator of the present invention used with system memory and a memory controller;

DESCRIPTION OF THE PREFERRED EMBODIMENT

Figure 3:
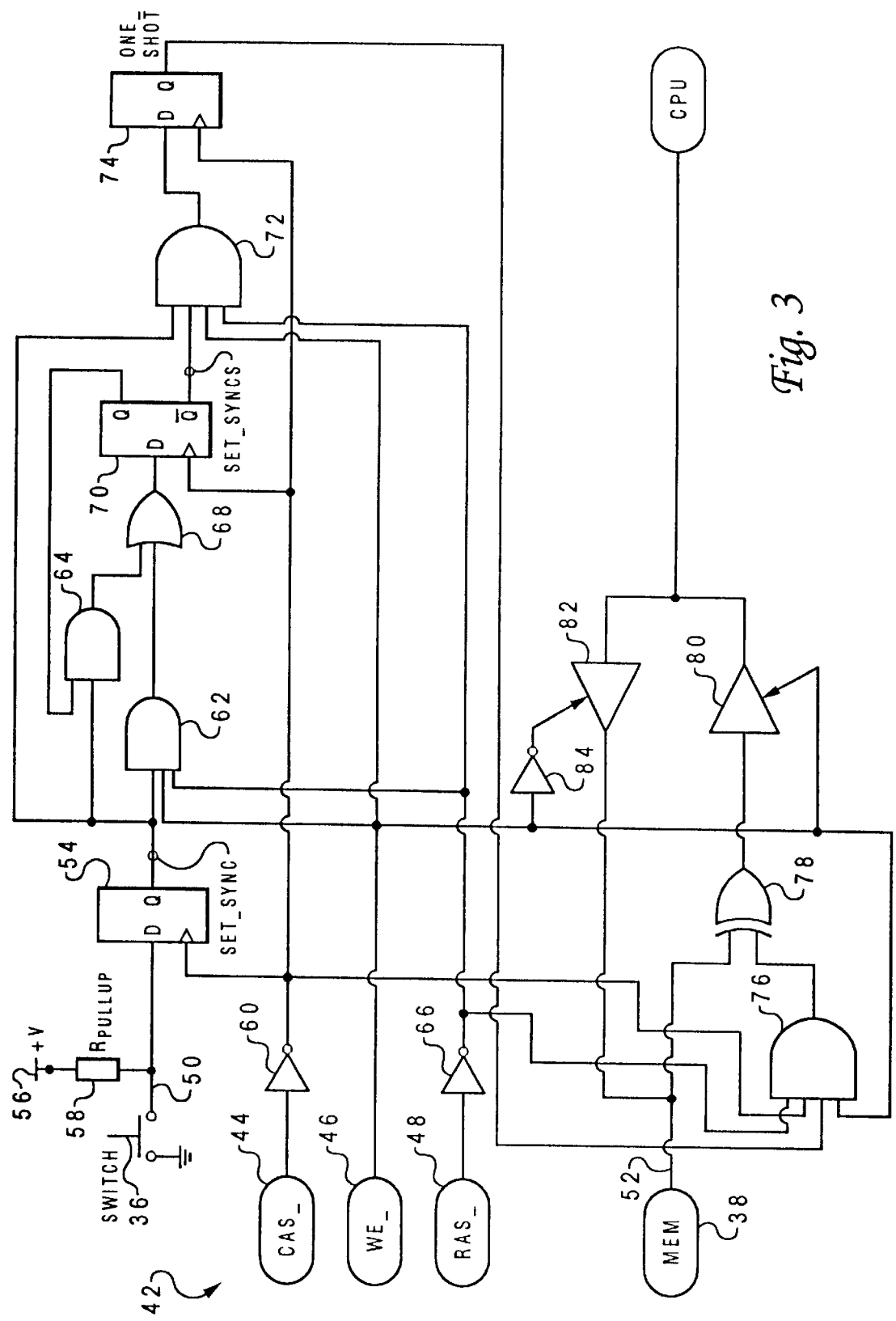
FIG. 3 is a schematic diagram of a programmable array logic (PAL) circuit used to generate errors according to the present invention.

With reference now to the figures, and in particular with reference to FIG. 2, there is depicted one embodiment 30 of the memory error generator of the present invention. In the depicted embodiment, error generator 30 is located on an interposer 32, and is generally comprised of a programmable array logic 34 and a switch 36. Interposer 32 provides interconnections between PAL 34 and a memory array 38, and also between PAL 34 and a memory controller 40 which is connected to the computer processor via a bus. Memory array 38 may be a dynamic random-access memory (DRAM) array, using a production dual in-line memory module (DIMM). PAL 34 and switch 36 could be integrally packaged with either the memory array or the memory controller, but the use of an interposer allows the generator to be used only during testing and removed before shipment of the computer system. Also, although PAL 34 is connected to memory controller 40 in the depicted embodiment, those skilled in the art will appreciate that it could be connected to some other system component which includes error detection or correction functionality, or to an interconnect bus which is further connected to such a component.

The programmable logic in PAL 34 is used to generate error data on memory-read cycles. Where a single parity bit is used to detect memory errors, a single memory bit in the data stream is complemented (i.e., its state is inverted, from high to low, or from low to high). Where error-correcting code memory is used, combinations of memory bits are complemented in the data stream being transmitted, i.e., two or more bits may be complemented. An exemplary PAL circuit 42 is shown in FIG. 3.

PAL circuit 42 has three primary inputs 44, 46 and 48, as well as an input 50 from switch 36, and an input 52 from memory 38. Input 50 from switch 36 is connected to a first (data) input of a storage element or flip-flop 54 which is also connected to a voltage source 56 via a pullup resistor 58. The second (clock) input of flip-flop 54 is connected to the output of an inverter 60 which receives input 44. Input 44 is connected to the column address strobe signal (CAS_) of memory array 38. In conventional memory arrays, memory cells are arranged in columns and rows, with a given memory word being constructed of bits (cells) which all lie in the same row. A memory word is accessed using the CAS_ signal along with a row address strobe signal (RAS_) to set the column and row addresses in the array. In the depicted implementation, the CAS_ signal is used to clock PAL circuit 42.

The output of flip-flop 54 (signal "SET_SYNC") is connected to the inputs of two AND gates 62 and 64. Gate 62 has a second input connected to input 46, and a third input connected to the output of an inverter 66 which receives input 48. Input 46 is connected to the write enable complement signal (WE_) of memory array 38, which is active depending upon whether the access operation to the memory array is a read operation, rather than a write operation. Input 48 is connected to the row address strobe signal (RAS_) of memory array 38. The output of gate 62 is connected to an input of an OR gate 68, whose other input is connected to the output of AND gate 64. The output of OR gate 68 is connected to the first (data) input of another flip-flop 70, whose second (clock) input is also connected to the output of inverter 60. The primary output of flip-flop 70 is fed back a second input of AND gate 64.

The complement output of flip-flop 70 (signal "SET_SYNC_S") is connected to an input of another AND gate 72. A second input of AND gate 72 receives the SET_SYNC signal from flip-flop 54. The other two inputs of AND gate 72 are connected to input 46 and to inverter 66, respectively. The output of AND gate 72 is connected to the first (data) input of flip-flop 74, and its second (clock) input is also connected to inverter 60. The output of flip-flop 74 (signal "ONE_SHOT") is connected to one of four inputs to another AND gate 76. The other three inputs are connected to the clocking signals, i.e., to inverter 60, input 46, and inverter 66, respectively. The output of AND gate 76 is connected to an input of an XOR gate 78 whose second input receives bit information from input 52, i.e., memory array 38. In this manner, the bit value from a memory cell is passed through XOR gate 78 unchanged, unless the output of AND gate 76 is turned on; in which case, the bit value is complemented.

Two controllable buffers 80 and 82 are used to route information depending upon whether a write or read operation is occurring. If a read operation is occurring, then buffer 80, which is controlled by the WE_ signal from input 46, passes the information from XOR gate 78 to the CPU or memory controller. If a write operation is occurring, buffer 80 will remain inactive, but buffer 82 will pass information from the CPU or memory controller directly to memory 38 via input 52. Buffer 82 is controlled by an inverter 84 whose input is connected to the WE_ signal.

Figure 4:
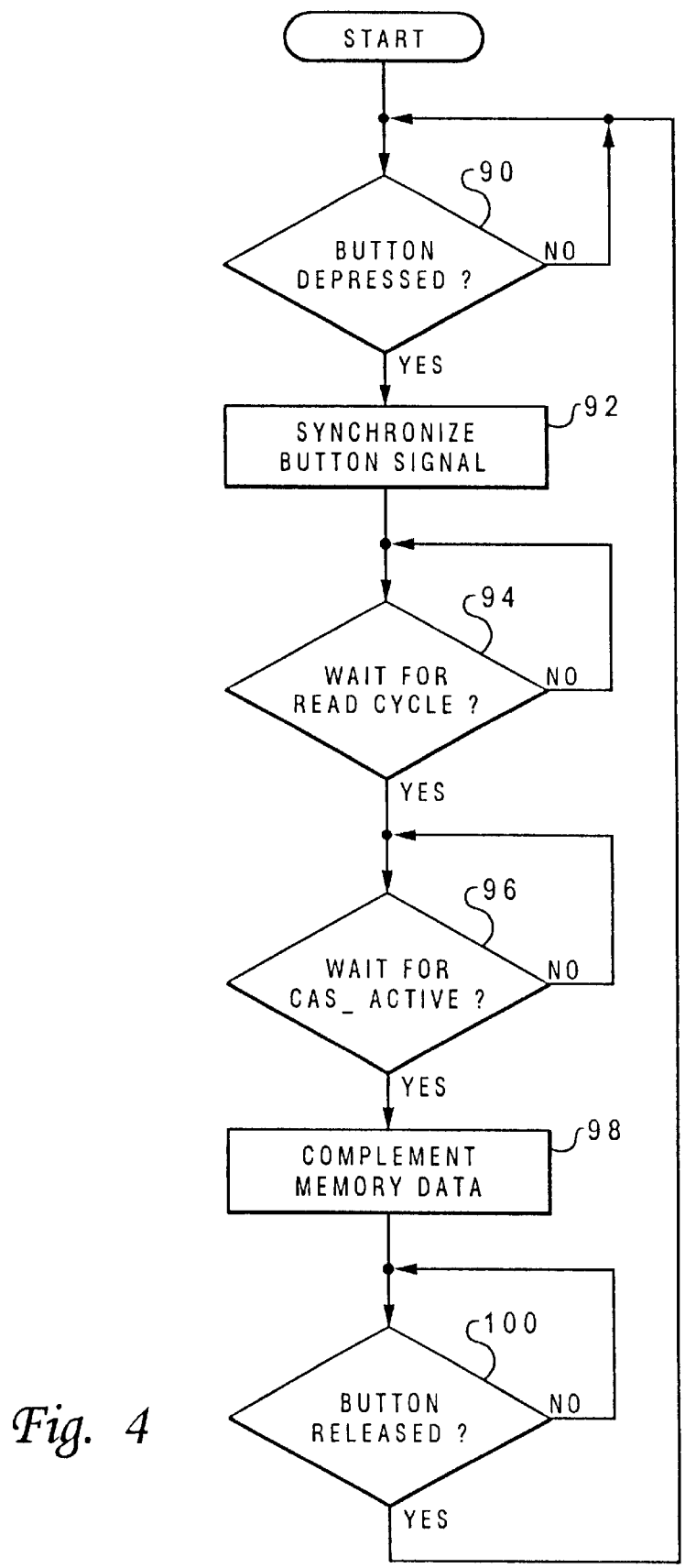
FIG. 4 is a chart depicting the logic flow associated with the PAL of FIG. 3.

The logic flow associated with PAL circuit 42 is shown in FIG. 4. The circuit is idle until the button on switch 36 is depressed (90). The button signal is then synchronized with the PAL circuit clock using the SET_SYNC signal (92). The circuit then waits for the next read cycle after the button has been depressed (94) (or makes sure that the read cycle is still active even if it began momentarily before the button was depressed), by examining the SET_SYNC_S signal. The circuit then waits for the next column address strobe signal (96) which sets the ONE_SHOT signal. The next bit read from memory is then complemented (98) by XOR gate 78. Only a single error is generated for each time the button is depressed, so the circuit waits for the button to be released before returning to the beginning of the logic flow (100).

The depicted implementation is for a parity check test wherein only one bit error is introduced, but those skilled in the art will appreciate that a double-bit error (or multiple-bit errors) can also be introduced by repeating the necessary logic components to PAL circuit 42. The following script is exemplary of a PAL implementation for a two-bit error generator:

```
PARITY DEVICE 'P16V8';              "device declarations
CLK                    PIN 1;       "input pin declarations
SET_                   PIN 2;
CAS_                   PIN 3;
WE_                    PIN 4;
```

-continued

```
RAS_                    PIN 5;
"SPARE PIN 7;           "SPARE PIN 8;        "SPARE PIN 9;
GND                     PIN 10;
OE_                     PIN 11;
CAS_INV                 PIN 12;              "output pin declarations
SET_SYNC                PIN 13;
SET_SYNC_S              PIN 14 ISTYPE 'REG';
ONE_SHOT                PIN 15 ISTYPE 'REG';
MEM2                    PIN 16;
CPU2                    PIN 17;
CPU1                    PIN 18;
MEM1                    PIN 19;
VCC                     PIN 20;
X      =                .X.;                 "constant declarations
Z      =                .Z.;
C      =                .C.;
L      =                0;
H      =                1;
EQUATIONS
SET_SYNC : = !SET_;                          "synchronize button
SET_SYNC.CLK = CLK;                          "wait for read cycle
SET_SYNC_S : = SET_SYNC * WE_ * !RAS_ # SET_SYNC_S * SET_SYNC;
SET_SYNC_S.CLK = CLK;                        "single shot at read cycle
ONE_SHOT : = SET_SYNC * !SET_SYNC_S * WE_ * !RAS_;
ONE_SHOT.CLK = CLK;
CPU1 = MEM1 $ (WE_ * !CAS_ * !RAS_ * ONE_    "flip first bit
SHOT);
CPU1.OE = WE_;
CPU2 = MEM2 $ (WE_ * !CAS_ * !RAS_ * ONE_    "flip second bit
SHOT);
CPU2.OE = WE_;
MEM1 = CPU1;                                 "pass CPU writes to memory
MEM1.OE = !WE_;
MEM2 = CPU2;                                 "pass second memory bit
MEM2.OE = !WE_;
CAS_INV = !CAS_;
END
```

The memory error generator of the present invention possesses many advantages over prior-arttest-pattern generators. First, data pattern generators do not test the response of the operational system, i.e., under more true-to-life circumstances where the actual memory modules are providing information to the memory controller and error detection device. Second, the memory error generator of the present invention is very inexpensive due to the use of the PAL, and is still flexible enough to provide both single- and multi-bit errors. Third, as noted above, the entire PAL circuit is clocked off of the CAS_ signal which means that the error generator does not require an external clock. Fourth, the unit easily operates off of the system voltage supplied via the memory controller (e.g., 3.3 volts or 5 volts). Finally, the logic is fast enough (about 5 nanoseconds) to flip the data bits and still meet the timing requirements of the memory controller.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. For example, if a specific sequence of errors were to be introduced in a memory word, the PAL could include a serial data input and a clock input to allow even more precise implementation of bit complementing. It is therefore contemplated that such modifications can be made without departing from the spirit or scope of the present invention as defined in the appended claims.

I claim:

1. A method of introducing an error into a data stream being transmitted in a computer system, comprising the steps of:

selectively activating an error-generation switch;

synchronizing an error generator using a clock signal provided by the computer system, in response to said activating step;

determining when the computer system first attempts to read from the data stream after said synchronizing step; and in response to said determining step, introducing an error in at least one bit of the data stream by complementing the bit.

2. The method of claim 1 wherein said introducing step introduces at least two errors by complementing two bits in the data stream.

3. The method of claim 1 wherein said introducing step introduces only one error in the data stream.

4. The method of claim 1 wherein said introducing step is accomplished using a programmable array logic (PAL) circuit which routes the data stream.

5. The method of claim 4 wherein the PAL circuit uses an XOR gate to complement the bit.

6. The method of claim 4 wherein the PAL circuit uses a controllable buffer to route the data stream when the computer system attempts to read the data stream.

7. The method of claim 1 wherein the data stream is information from a memory array of the computer system which is being transmitted to a memory controller of the computer system, and said introducing step occurs quickly enough to meet timing requirements of the memory controller.

8. A device for generating an error in a data stream being transmitted in a computer system, comprising:

a switch;

a programmable array logic (PAL) circuit connected to said switch, having means for introducing an error in at least one bit of the data stream by complementing the bit, in response to selective activation of said switch; and means for interconnecting said PAL circuit with the computer system.

9. The device of claim 8 wherein said PAL circuit further has means for determining when the computer system first attempts to read from the data stream after said activation of said switch.

10. The device of claim 8 wherein:

the data stream is information from a memory array of the computer system which is being transmitted to a memory controller of the computer system; and said interconnecting means comprises an interposer supporting said PAL circuit and said switch, and having connections for interconnecting the PAL circuit to both the memory array and the memory controller.

11. The device of claim 8 wherein said error introducing means of said PAL circuit introduces at least two errors by complementing two bits in the data stream.

12. The device of claim 8 wherein said PAL circuit includes an XOR gate to complement the bit.

13. The device of claim 12 wherein said PAL circuit includes a controllable buffer, connected to an output of said XOR gate, to route the data stream when the computer system attempts to read the data stream.

14. The device of claim 8 wherein said PAL circuit is synchronized by a clock signal provided by the computer system.

15. A computer system comprising:

a processor;

a memory array;

a memory controller;

a bus for interconnecting the memory controller with the processor; and a memory error generator connected to said memory array and said memory controller, including an error-generation switch, and having means for introducing an error in at least one bit of a data stream transmitted from said memory array to said memory controller, by complementing the bit in response to selective activation of an error generation switch.

16. The computer system of claim 15 wherein said memory error generator is removably connected to said memory array and said memory controller.

17. The computer system of claim 16 wherein said memory error generator includes a programmable array logic (PAL) circuit connected to said switch.

18. The computer system of claim 17 wherein said PAL circuit includes:

a n XOR gate for complementing the bit; and a controllable buffer, connected to an output of said XOR gate, to route the data stream when the computer system attempts to read from said memory array.

* * * * *